US005508885A

United States Patent [19]

Ishimoto

[11] Patent Number: 5,508,885

[45] Date of Patent: Apr. 16, 1996

[54] IC CARD HAVING IMPROVED HEAT DISSIPATION

[75] Inventor: Shin-ichi Ishimoto, Itami, Japan

[73] Assignee: Mitsubishi Denki Kabushiki Kaisha, Tokyo, Japan

[21] Appl. No.: 231,913

[22] Filed: Apr. 25, 1994

[30] Foreign Application Priority Data

Apr. 26, 1993 [JP] Japan .................................... 5-099797

[51] Int. Cl.$^{6}$ ........................................ H05K 7/20

[52] U.S. Cl. ........................... 361/720; 361/704; 361/705

[58] Field of Search .................................... 361/704, 705, 361/720; 235/487

[56] References Cited

U.S. PATENT DOCUMENTS

| | | | |
|---|---|---|---|
| 3,061,760 | 10/1962 | Ezzo | 361/704 |
| 4,475,145 | 10/1984 | Heil et al. | 361/720 |
| 4,949,225 | 8/1990 | Sagisaka et al. | 361/720 |
| 5,229,327 | 7/1993 | Farnworth | 437/20 G |
| 5,262,922 | 11/1993 | Yamaji et al. | 361/720 |

FOREIGN PATENT DOCUMENTS

| | | | |
|---|---|---|---|
| 5744552 | 8/1955 | Japan . | |
| 0282983 | 12/1986 | Japan | 235/487 |
| 62-127292 | 6/1987 | Japan . | |
| 0032092 | 2/1991 | Japan | 361/720 |
| 3182397 | 8/1991 | Japan . | |
| 4291999 | 10/1992 | Japan | 361/720 |

*Primary Examiner*—Donald T. Hajec
*Assistant Examiner*—Tho Phan
*Attorney, Agent, or Firm*—Leydig, Voit & Mayer

[57] ABSTRACT

An IC card includes a ground pattern of high heat conductivity disposed between a substrate and a mounted element, such as a semiconductor element, and in contact with the mounted element. Heat generated by the mounted element is transmitted through the ground pattern and ground terminals to which the ground pattern is connected and radiated by a cooling system disposed outside of the IC card. Therefore, heat generated by the mounted element can be radiated efficiently and malfunctioning of the mounted element due to heat can be prevented, resulting in improved electrical reliability.

4 Claims, 3 Drawing Sheets

IC CARD HAVING IMPROVED HEAT DISSIPATION

BACKGROUND OF THE INVENTION

The present invention relates to an IC card and, more particularly, to an IC card radiating heat which mounted elements such as semiconductor elements generate when put into operation.

FIG 6 is a sectional view showing a structure of a known IC card. In FIG. 6, an IC card 1 comprises three side walls as a main frame 5 of molded resin, a top and bottom made of conductive panels 2*a* and 2*b* and attached to the main frame 5 from above and below, and a connector 8 having a terminal 7 for transferring signals to or from an external unit and formed on the other side wall. A substrate 3 is, as illustrated, mounted in the IC card 1. One end of the terminal 7 is attached to the substrate 3. A conducting means 6 such as a spring is disposed in the IC card 1 so that the conducting means 6 electrically connects the two conductive panels 2*a* and 2*b* the top and bottom of the IC card 1. On the substrate 3, as illustrated, elements 4 including semiconductor elements 4*a* and wiring patterns (not shown) are mounted. The mounted elements 4 and terminal 7 are electrically connected to one another through the wiring patterns.

In the known IC card, as mentioned above, the semiconductor elements 4*a* on the substrate 3 may produce a considerable quantity of heat when put into operation, and malfunction eventually. It is therefore required generated by the semiconductor elements 4*a* . In the known IC card, as shown in FIG. 6, the heat generated by the semiconductor elements 4*a* is transmitted from the packing of the semiconductor elements 4*a* to the conductive panels 2*a* and 2*b* through the air inside the IC card, and then radiated outside through the conductive panels 2*a* and 2*b*. Otherwise, the heat is transmitted to the substrate 3 through leads 4*aa* attached to the semiconductor elements 4*a*, transferred from the substrate 3 to the air within the IC card, and then radiated outside through the conductive panels 2*a* and 2*b*. Thus, heat is radiated via the air inside an IC card. This causes the temperature inside the IC card to considerably, resulting in inefficient heat radiation.

A structure designed to cope with this requirement of heat radiation is disclosed in, Japanese Patent Laid-Open No.3-182397 wherein a space between the semiconductor elements 4*a* and casing conductive panel 2*a* is filled with an adhesive made of a material of high heat conductivity. However, in the IC card having the above structure disclosed in Japanese Patent Laid-Open No. 3-82397, since the IC card is usually inserted into a host device such as a reader/writer during operation, the heat generated by the host device may be transmitted inversely to the semiconductor elements 4*a* mounted in the IC card through the casing conductive panel 2*a* and the adhesive filled between the semiconductor elements 4*a* and the casing conductive panel 2*a*. Therefore, the heat generated from the semiconductor elements 4*a* mounted in the IC card cannot be radiated efficiently.

SUMMARY OF THE INVENTION

The present invention attempts to solve the foregoing problems. An object of the present invention is to provide an IC card efficiently radiating heat generated by the semiconductor elements 4*a* outside of the IC card and preventing the semiconductor elements 4*a* from malfunctioning due to the heat.

Accordingly, the present invention provides an IC card comprising substrate, mounted elements mounted on the substrate, and a heat conduction path made of a material of high heat conductivity and disposed between the substrate and mounted element, at least at one end, for transmitting and radiating heat generated by the mounted element mounted on the substrate to the outside.

Further, the heat conduction path may comprise a ground pattern made of a material of high heat conductivity and having at least one portion disposed between the substrate and mounted element for transmitting and radiating therethrough heat generated by the mounted element to the outside.

Still further, the heat conduction path may comprise a Peatier element of two different materials of high heat conductivities and disposed between the substrate and a mounted element for absorbing heat generated by the mounted element and radiating the heat to the outside.

The IC card of the present invention efficiently transmits heat generated by mounted elements which are mounted on a substrate via a heat conduction path made of a material of high heat conductivity and having at least one end portion disposed between the mounted elements and substrate. The heat is then radiated outside of the IC card, whereby the mounted elements mounted on the substrate are prevented from malfunctioning.

Further, heat generated by mounted elements mounted on a substrate may be efficiently radiated outside from the IC card via a ground pattern made of a material of high heat conductivity and having at least one portion disposed between the substrate and mounted elements.

Alternatively, peltier elements may be provided between a substrate and mounted elements mounted on the substrate. In this case, when current flows through the Peltier elements, the peltier elements absorb heat generated by the mounted elements. Thus, the heat is radiated outside from the IC card through the Peltier elements.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
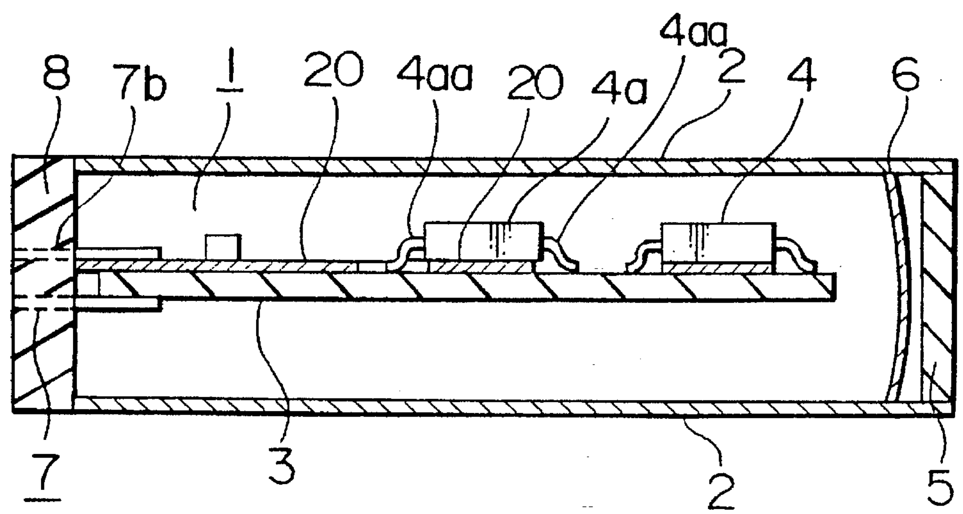
FIG. 1 is a sectional view showing a structure of an IC card according to an embodiment of the present invention.
Figure 2:
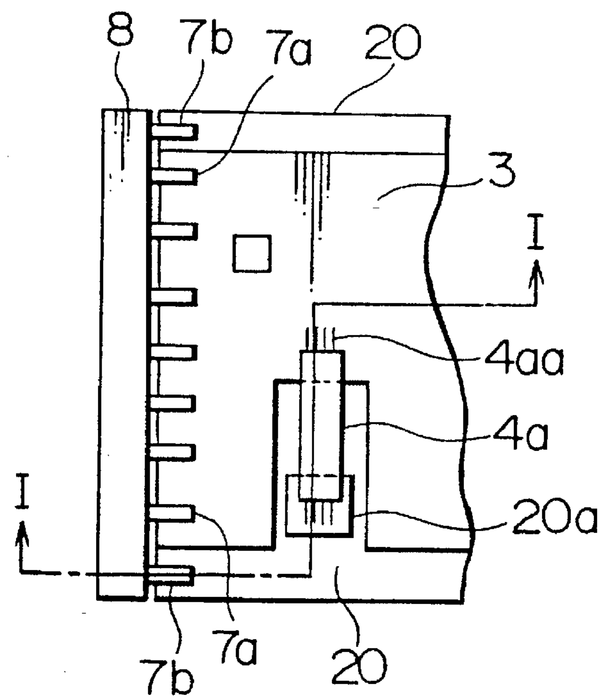
FIG. 2 is a fragmented top view of the embodiment of the IC card illustrated in FIG. 1 but with a casing panel removed for clarity.

Embodiments of the present invention will be described in conjunction with the appended drawings. FIG. 1 is a sectional view of an embodiment according to the IC card of the present invention. FIG. 2 is a fragmented top view of the IC card shown in FIG. 1 but with the upper casing panel removed for clarity. Part of FIG. 1 is a sectional view taken along line I—I in FIG. 2. In FIGS. 1 and 2, an IC card 1 comprises a top and a bottom made of conductive panels 2*a* and 2*b*, and three side walls made of a resin main frame 5. The conductive panels 2*a* and 2*b* are electrically connected to each other by means of a conducting means 6 such as a spring disposed in the IC card. A substrate 3 is mounted in the IC card 1 on which, as illustrated, semiconductor elements 4*a* and others are mounted. A connector 8 having terminals 7 is disposed on the other side wall of the IC card 1. The terminals 7 include signal terminals 7*a* connected to signal line patterns (not shown) for use in transferring signals to or from an external unit and ground terminals 7*b* connected to a ground pattern 20. One end of each of the terminals 7 is attached to the substrate 3.

In the embodiment of the IC card of the present invention, the ground pattern 20 is disposed on the substrate 3 as shown in FIG. 2. The ground pattern 20 is continuous in the area of the substrate 3 under the semiconductor elements 4*a* except areas on the substrate 3 in which terminals are present for connection to leads 4*aa* of the semiconductor elements 4*a*, and in the area along the edges of the substrate 3. In the areas under the semiconductor elements 4*a*, the ground pattern 20 is between the substrate 3 and semiconductor elements 4*a* and contacts the bottoms of the semiconductor elements 4*a*. In the areas 20*a* of the substrate 3 in which terminals are located, all signal line patterns (not shown) connected to the leads 4*aa* may be drawn down to the back of the substrate 3 via for, example, through holes in the substrate 3 under the semiconductor elements 4*a*. The ground pattern 20 is made of a metallic material of high heat conductivity such as copper or aluminum and fixed to the substrate 3 by plating or printing. The ground pattern 20 is connected to a known suitable cooling system disposed outside of the IC card 1 through the ground terminals 7*b*, which is, for example, disclosed in Japanese Patent Laid-Open No. 62-127292 hereby incorporated by reference. As described in above Japanese Patent Laid-Open No. 62-127292, the cooling system may be provided within a host device such as a reader/writer into which the IC card is inserted during operation.

Heat generated by the semiconductor elements 4*a* is absorbed by the ground pattern 20 disposed between the semiconductor elements 4*a* and substrate 3 and transmitted to the cooling system outside of the IC card 1 via the ground terminals 7*b*, and then it is radiated outside. The cooling system has, for example, a heat insulating board or a known heat sink disclosed, for example, in Japanese Utility Model Laid-Open No. 57-44552. Heat generated by the semiconductor elements 4*a* and transmitted by the ground pattern 20 and ground terminals 7*b* is provided to the heat insulating board or the heat sink, and then radiated outside. In this embodiment, the ground pattern 20, ground terminals 7*b*, and the heat insulating board or heat sink disposed in the cooling system comprise a heat conduction path made of a material of high heat conductivity. For further improvement inefficiency of heat radiation, a fan may be provided for cooling the heat insulating board or heat sink.

In FIG. 1, the mounted elements 4, such as the semiconductor elements 4*a*, are mounted on only one surface of the substrate 3. However, the mounted elements 4 may be mounted on both surfaces of the substrate 3. In this case, the ground pattern 20 also may be disposed on both surfaces of the substrate 3. Alternatively, through holes (See 3*a* in FIG. 3) may be formed in the substrate 3, and the ground pattern 20 disposed on one surface of the substrate 3 as shown in FIG. 1 may be connected in common to the mounted elements 4 mounted on the both surfaces of the substrate 3 so that heat generated by the mounted elements 4 can be radiated outside of the IC card 1 via the common ground pattern 20. In this embodiment, the ground pattern 20 made of a material of high heat conductivity and having a large width is disposed on the substrate 3, and heat generated by the semiconductor elements 4*a* is radiated outside via the ground pattern 20. Heat can therefore be radiated efficiently and the semiconductor elements 4*a* can be prevented from malfunctioning due to the heat. Since the ground pattern 20 is employed, the manufacturing process is very simple. Moreover, since the ground pattern 20 has a large width, the IC card is electrically stable and offers high precision electrical characteristics.

Figure 3:
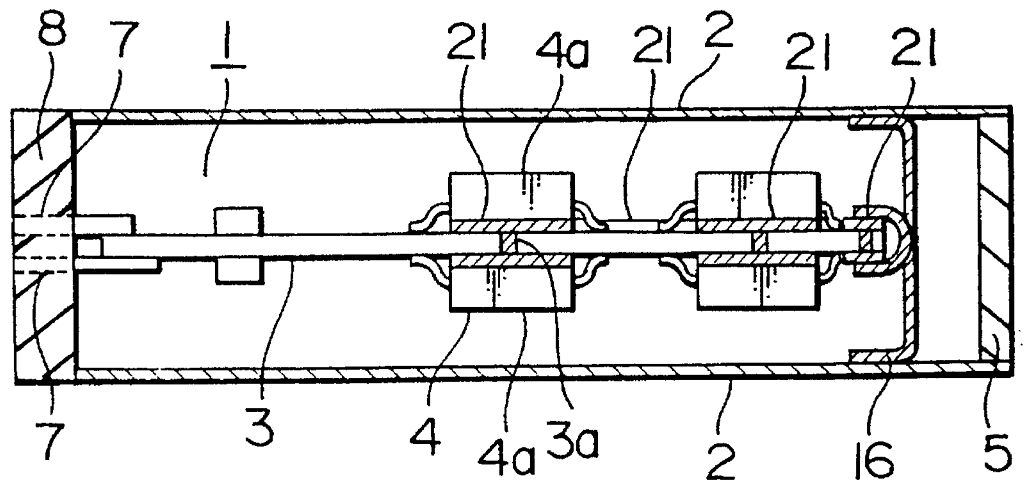
FIG. 3 is a sectional view showing a structure another embodiment.

FIG. 3 is a sectional view of another embodiment of the present invention. As shown in FIG. 3, dedicated heat conduction path patterns 21 for exclusive use in transmitting heat generated by the semiconductor elements 4*a* and radiating the heat outside are disposed on the substrate 3 instead of the ground pattern 20 in the embodiment illustrated in FIG. 1. The other structures are same as those of the embodiment shown in FIG. 1 and they are therefore assigned the same reference numerals as those in the embodiment of FIG. 1 and a description of them is omitted. The dedicated heat conduction path patterns 21 can be formed using the some known suitable method same as a standard electrical wiring pattern. The dedicated heat conduction path patterns 21 are made of a material of high heat conductivity such as copper or aluminum. At least one end of each of the dedicated heat conduction path patterns 21 is substantially square to match with the shapes of the bottom of the semiconductor elements 4*a*, and attached to the entire bottom of a the semiconductor element 4*a* as shown in FIG. 3 so that heat is transmitted therethrough. The other ends of the patterns 21 are connected to a conducting means 16 such as a spring disposed in the IC card as illustrated in FIG. 3. The conducting means 16 is made of a metal having relatively high heat conductivity, and shaped like a combination of large and small arch-like springs. The conducting means 16 is connected to the dedicated heat conduction path patterns 21 on the substrate 3 and also to the conductive panels 2 serving as the top and bottom of the IC card 1. Heat generated by the semiconductor elements 4*a* is transmitted to the conductive panels 2 via the dedicated heat conduction path patterns 21 and conducting means 16, and then radiated outside. A heat conduction path made of a material of high heat conductivity in this embodiment is comprises of the dedicated heat conduction path patterns 21, conducting means 16, and conductive panels 2.

Figure 6:
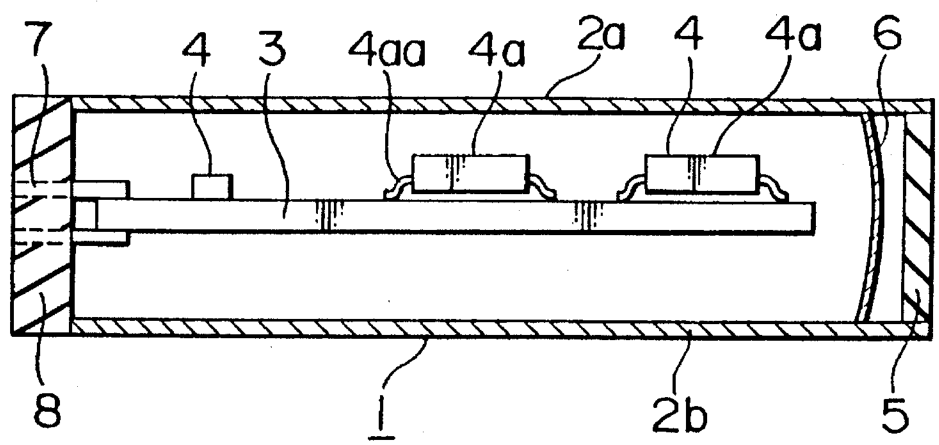
FIG. 6 is a sectional view of a known IC card.

As shown in FIG. 3, through holes 3*a* may be formed in the substrate 3 and the dedicated heat conduction path pattern 21 disposed on one surface of the substrate 3 may be drawn to the other surface thereof via the through holes 3*a* and connected to the dedicated heat conduction path pattern 21 on the other surface so that the heat conduction path pattern 21 on one surface of the substrate 3 may be commonly used for heat transmission. This structure can prevent congestion of wiring patterns on the substrate. In this embodiment, heat conduction is not dependent on the air within the IC card. Since the dedicated heat conduction path patterns 21 made of a material of high heat conductivity are disposed on the entire bottoms of the semiconductor elements 4*a*, heat is absorbed from the bottoms of the semiconductor elements 4*a* via the dedicated heat conduction patterns 21, and transmitted to the casing panels 2 of the IC card for radiation. The temperature in the IC card does not therefore rise. Heat radiation can be carried out easily and much more efficiently when heat is carried out through air as illustrated in FIG. 6. Consequently, the semiconductor elements 4*a* can be prevented from malfunctioning due to heat.

Also in this embodiment, similar to the embodiment shown in FIG. 1, a cooling system may be disposed outside of the IC card 1 and may be connected to the dedicated heat conduction path patterns 21. In this case, heat conduction is realized via the dedicated heat conduction path patterns 21 and heat radiation is effected by the cooling system. The heat transmitted to the conducting means 16 and casing conductive panels 2 for radiation may be used in combination with the cooling system, resulting in more efficient heat radiation.

Figure 4:
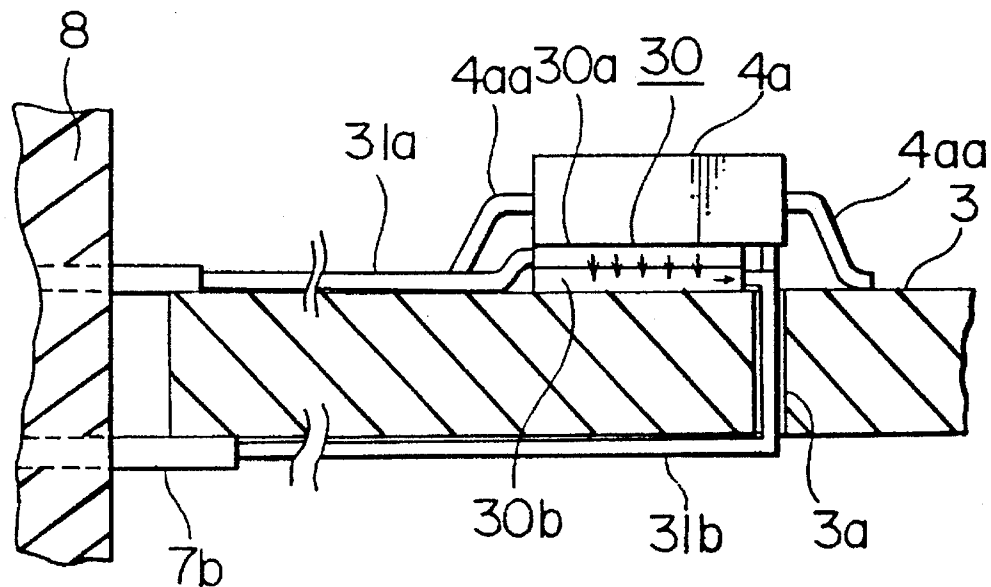
FIG. 4 is a fragmentary enlarged view of still another embodiment.
Figure 5:
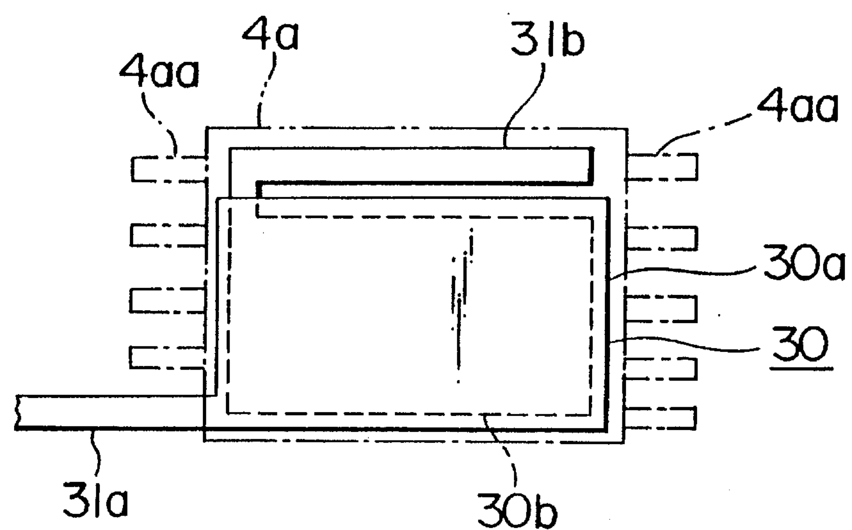
FIG. 5 is an enlarged top view of a Peltier element mounted in the embodiment illustrated in FIG. 4.

FIG. 4 is a fragmentary enlarged sectional view of still another embodiment. In this embodiment, Peltier element 30, which is electronic cooling element, is disposed between the semiconductor elements 4*a* and substrate 3. Current flows through the Peltier element 30, whereby heat generated by the semiconductor elements 4*a* is absorbed by the Peltier element 30. The other structures are the same as those of the above embodiments, so description is omitted. The Peltier element is an element made of two different conductors. When current flows therethrough, heat dissipation or absorption occurs at a junction of the two conductors in the direction of the flowing current in a quantity proportional to the current flow. FIG. 5 is an enlarged view of a Peltier element 30 in this embodiment. A semiconductor element 4*a* is illustrated by a double dotted phantom line, and leads 4*aa* are illustrated by a single dotted phantom lines. The Peltier element 30 includes pairs of two different plate-type conductors 30*a* and 30*b* each having high heat conductivity laminated and joined as illustrated in FIGS. 4 and 5. The plate-type conductors 30*a* and 30*b* are electrically connected to Peltier element wiring patterns 31*a* and 31*b*, respectively. The Peltier element wiring patterns 31*a* and 31*b* are made of a material of high heat conductivity such as copper or aluminum. Respective major surfaces of each of the plate-type conductors 30*a* and 30*b* are joined to the semiconductor element 4*a* and substrate 3.

When current flows through the Peltier element 30 via the Peltier element wiring patterns 31*a* and 31*b*, heat is transmitted at the junction between the plate-type conductors 30*a* and 30*b* from the plate-type conductor 30*a* to the plate-type conductor 30*b* in a quantity proportional to the current flow owing to the characteristic of the Peltier element 30. As a result, the semiconductor element 4*a* is cooled. The current path in the above case extends from the Peltier element wiring pattern 31*a* through the plate-type conductor 30*a*, the junction between the plate-type conductors 30*a* and 30*b*, and the plate-type conductor 30*b* to the Peltier element wiring pattern 31*b*. The Peltier element wiring pattern 31*b* is, as shown in FIG. 4, drawn down to the back surface of the substrate 3 through a through hole 3*a* in the substrate 3 and it runs on the back surface of the substrate 3 so that it is connected to the ground terminals 7*b* on the back surface of the substrate 3. The Peltier element wiring pattern 31*b* may be used also as a, ground pattern for the semiconductor element 4*a*.

heat generated by the semiconductor elements 4*a* is cooled by the plate-type conductors 30*a* of the Peltier elements 30, while the temperature of the plate-type conductors 30*a* rises considerably. Heat transmitted from the plate-type conductors 30*a* of the Peltier elements 30 is transmitted to a cooling system (not shown) disposed outside of the IC card 1 through the Peltier element wiring patterns 31*b* and the ground terminals 7*b* to which the Peltier element wiring patterns 31*b* are connected, and then radiated outside, similar to in the embodiment illustrated in FIG. 1.

A heat conduction path made of a material of high heat conductivity in this embodiment is composed of the Peltier element 30, Peltier element wiring patterns 31*b*, ground terminals 7*b*, and a heat insulating board or heat sink in the cooling system. Similar to the embodiment illustrated in FIG. 3, even in this embodiment, dedicated heat conduction path patterns (See 21 in FIG. 3) made of a material of high heat conductivity may be provided. In this case, the dedicated heat conduction path patterns may be connected at one end to the conducting means (16 in FIG. 3), joined with conductive panels (See 2 in FIG. 3), and connected at the other end to the plate-type conductors 30*b* of Peltier element 30. Thus, heat generated by the semiconductor elements 4*a* may be transmitted to the conductive panels through the dedicated heat conduction path patterns and conducting means, and then radiated outside.

In this embodiment, as described above, since the Peltier element 30 that is electronic cooling element is joined with the entire bottoms of the semiconductor elements 4*a*, and current flows through the Peltier elements 30 so that heat generated by the semiconductor elements 4*a* is absorbed and transmitted outside of the IC card 1, heat radiation can therefore be achieved quite efficiently.

As has been described above, in an IC card of the present invention, a heat conduction path made of a material of high heat conductivity is arranged with one end between the substrate 3 and the mounted elements 4, such as the semiconductor elements 4*a* mounted on a substrate 3. Heat generated by the semiconductor elements 4*a* is radiated outside via the heat conduction path. Heat can therefore be radiated efficiently, and the semiconductor elements 4*a* can be prevented from malfunctioning due to the heat.

Further, in the embodiment illustrated in FIG. 1, a ground pattern 20 made of a material of high heat conductivity is used for radiating heat generated by mounted elements, such as semiconductor elements 4*a* to the outside. Heat can therefore be radiated efficiently, and the manufacturing process is simplified. Moreover, since the ground pattern has a large width, electrical stability is attained. This results in the high precision in electrical characteristics and high electrical reliability.

In the embodiment illustrated in FIG. 4, Peltier element including two different plate-type conductors made of a material of high heat conductivity is disposed between mounted elements, such as semiconductor elements 4*a* and substrate 3. When current flows through the Peltier elements, heat generated from the mounted elements, such as the semiconductor elements 4*a*, can be radiated outside more efficiently owing to the Peltier effect.

What is claimed is:

1. An IC card comprising:

a frame including first, second, and third side walls;

a connector having a terminal, mounted to said frame, and forming, with said frame, a four-sided structure;

electrically and thermally conductive top and bottom panels disposed on opposite sides of said frame defining a closed volume within said frame between said top and bottom panels;

a circuit board having opposed first and second surfaces and mounted at one end to said connector within the volume;

a first heat-generating element mounted on said first surface of said circuit board;

a first heat conduction path pattern disposed on the first surface of said circuit board partially between said circuit board and said first heat-generating element; and an electrically and thermally conducting member disposed within the volume and electrically and thermally connected to said top and bottom panels and to said first heat conduction path pattern.

2. The IC card according to claim 1 comprising:

a second heat-generating element mounted on the second surface of said circuit board; and a second heat conduction path pattern disposed on the second surface of said circuit board and partially between said circuit board and said heat-generating element, wherein said first and second heat conduction patterns are electrically and thermally connected to each other.

3. The IC card according to claim 1 wherein said electrical and thermal conducting member contacts said first heat-conduction path pattern at a distal end of said circuit board opposite said connector.

4. The IC card according to claim 3 wherein said conducting member includes a U-shaped clip receiving the distal end of said circuit board.

* * * * *